United States Patent
Yu et al.

(10) Patent No.: US 11,665,944 B2
(45) Date of Patent: May 30, 2023

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Pengfei Yu, Beijing (CN); Haigang Qing, Beijing (CN); Tinghua Shang, Beijing (CN); Jie Dai, Beijing (CN); Lu Bai, Beijing (CN); Chenxing Wan, Beijing (CN); Qiang Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 223 days.

(21) Appl. No.: 17/297,583

(22) PCT Filed: Aug. 6, 2020

(86) PCT No.: PCT/CN2020/107559
§ 371 (c)(1),
(2) Date: May 27, 2021

(87) PCT Pub. No.: WO2022/027506
PCT Pub. Date: Feb. 10, 2022

(65) Prior Publication Data
US 2022/0310745 A1    Sep. 29, 2022

(51) Int. Cl.
*H01L 27/12*    (2006.01)
*G09G 3/32*    (2016.01)
*G09G 3/3266*    (2016.01)

(52) U.S. Cl.
CPC ......... *H10K 59/131* (2023.02); *G09G 3/3266* (2013.01); *H10K 59/122* (2023.02)

(58) Field of Classification Search
CPC ............. H01L 25/0655; H01L 25/0753; H01L 25/167; H01L 27/1218; H01L 27/124;
(Continued)

(56) References Cited

U.S. PATENT DOCUMENTS 9,991,462 B2    6/2018 Park et al.
10,276,644 B2    4/2019 You et al.
(Continued)

FOREIGN PATENT DOCUMENTS

CN    102540603 A    7/2012
CN    106847867 A    6/2017
(Continued)

*Primary Examiner* — Insa Sadio
(74) *Attorney, Agent, or Firm* — ArentFox Schiff LLP; Michael Fainberg

(57) ABSTRACT

Embodiments of the present disclosure provide a display panel and a display device. The display panel includes a substrate; a first electrode; a second electrode; an organic light-emitting functional layer; a line scanning drive circuit located in a surrounding area; a first flat layer; a fixed potential signal line located in the surrounding area, wherein the fixed potential signal line includes a first and a second conductive parts; an overlapping area is formed between an orthographic projection of the second conductive part on the substrate and an orthographic projection of the line scanning drive circuit on the substrate; the second conductive part includes a plurality of first through holes; and a conductive connection layer; and the conductive connection layer and the second conductive part at least are in direct contact in the overlapping area between the second conductive part and the line scanning drive circuit.

20 Claims, 6 Drawing Sheets

(58) Field of Classification Search
CPC ............. H01L 27/1244; H01L 27/1248; H01L 27/1262; H01L 27/156
See application file for complete search history.

(56) References Cited

U.S. PATENT DOCUMENTS

| | | |
|---|---|---|
| 2012/0153292 A1 | 6/2012 | Nakamura et al. |
| 2013/0009162 A1 | 1/2013 | Kang |
| 2014/0375916 A1* | 12/2014 | Chen .................. H01L 27/1218 349/33 |
| 2015/0187807 A1* | 7/2015 | Tsuruoka .............. H01L 23/481 257/347 |
| 2019/0305003 A1 | 10/2019 | Tan et al. |

FOREIGN PATENT DOCUMENTS

| | | |
|---|---|---|
| CN | 108461530 A | 8/2018 |
| CN | 109037279 A | 12/2018 |
| CN | 210722408 U | 6/2020 |

* cited by examiner

DISPLAY PANEL AND DISPLAY DEVICE

CROSS-REFERENCE TO RELATED APPLICATIONS

This application is a National Stage of International Application No. PCT/CN2020/107559, filed Aug. 6, 2020, which is hereby incorporated by reference in its entirety.

FIELD

The present disclosure relates to the technical field of display, in particular to a display panel and a display device.

BACKGROUND

With the development of display equipment, high resolution, high refresh rate and narrow bezel have become development tendency of the display equipment. Due to the narrow bezel of the display equipment, an overlap area located between a fixed potential signal line in a bezel region and a corresponding conductive connection layer is narrowed.

SUMMARY

The embodiments of the present disclosure provide a display panel. The display panel includes a display area and a surrounding area and further includes:

a substrate;

a first electrode, located on the substrate in the display area;

a second electrode, located on one side, departing from the substrate, of the first electrode;

an organic light-emitting functional layer, located in the display area and between the first electrode and the second electrode;

a line scanning drive circuit, located on the substrate in the surrounding area;

a first flat layer, located on one side, away from the substrate, of the line scanning drive circuit;

a fixed potential signal line located in the surrounding area, wherein the fixed potential signal line includes a first conductive part, and a second conductive part located on one side, away from the substrate, of the first conductive part;

an orthographic projection of the first conductive part on the substrate and an orthographic projection of the line scanning drive circuit on the substrate do not overlap with each other;

the second conductive part is located on one side, away from the substrate, of the first flat layer; an overlapping area is formed between an orthographic projection of the second conductive part on the substrate and the orthographic projection of the line scanning drive circuit on the substrate;

the second conductive part includes a plurality of first through holes; an orthographic projection of the plurality of first through holes on the substrate is located in the overlapping area between the second conductive part and the line scanning drive circuit; and a conductive connection layer, located on one side, away from the substrate, of the second conductive part, and arranged on a layer same as a layer on which the first electrode is, wherein the conductive connection layer and the second conductive part at least are in direct contact in the overlapping area between the second conductive part and the line scanning drive circuit.

Optionally, in some embodiments of the present disclosure, the conductive connection layer includes a plurality of second through holes that correspond to the plurality of first through holes respectively; and an overlapping area is formed between the orthographic projection of the first through holes on the substrate and an orthographic projection of the corresponding second through holes on the substrate.

Optionally, in some embodiments of the present disclosure, pore sizes of the second through holes are greater than pore sizes of the corresponding first through holes.

Optionally, in some embodiments of the present disclosure, the first flat layer is located on one side, away from the substrate, of the first conductive part and coats the side edge of the first conductive part.

Optionally, in some embodiments of the present disclosure, the display panel further includes a second flat layer located between the second conductive part and the conductive connection layer, wherein the second flat layer includes a filling part;

the filling part is configured to fill each of the first through holes; and the filling part covers the surface of the second conductive part on the edge of each of the first through holes.

Optionally, in some embodiments of the present disclosure, the second flat layer coats the side edge of the second conductive part.

Optionally, in some embodiments of the present disclosure, the conductive connection layer coats the side edge of the filling part.

Optionally, in some embodiments of the present disclosure, the filling part includes a first filling part and a second filling part;

the first filling part is configured to fill one of the first through holes;

the second filling part is configured to fill at least two of the first through holes; and the edge of the second filling part is of a zigzag shape meshed with the edges of the first through holes.

Optionally, in some embodiments of the present disclosure, the display panel further includes a pixel defining layer located on one side, away from the substrate, of the conductive connection layer;

wherein the pixel defining layer fills each of the second through holes and covers the surface of the conductive connection layer on the edge of each of the second through holes.

Optionally, in some embodiments of the present disclosure, the line scanning drive circuit includes a luminous control signal drive circuit and a gate control signal drive circuit, wherein the gate control signal drive circuit is located on one side, close to the display area, of the luminous control signal drive circuit; and an orthographic projection of the edge of one side, close to the display area, of the second conductive part on the substrate is located in a range of an orthographic projection of the gate control signal drive circuit on the substrate.

Optionally, in some embodiments of the present disclosure, the luminous control signal drive circuit includes a plurality of first drive units;

the plurality of first through holes in the second conductive part include a plurality of first repeating groups that correspond to positions of the first drive units respectively; and each first repeating group includes at least one of the first through holes.

Optionally, in some embodiments of the present disclosure, the gate control signal drive circuit includes a plurality of second drive units;

the plurality of first through holes in the second conductive part further include a plurality of second repeating groups that correspond to positions of the second drive units respectively; and each second repeating group includes at least one of the first through holes.

Optionally, in some embodiments of the present disclosure, the conductive connection layer further includes a plurality of third through holes; and an overlapping area is formed between an orthographic projection of the third through holes on the substrate and an orthographic projection of the second flat layer on the substrate.

Optionally, in some embodiments of the present disclosure, the pixel defining layer fills each of the third through holes and covers the surface of the conductive connection layer on the edge of each of the third through holes.

Correspondingly, some embodiments of the present disclosure further provide a display device. The display device includes any of the above display panels.

DETAILED DESCRIPTION OF THE EMBODIMENTS

Figure 1:
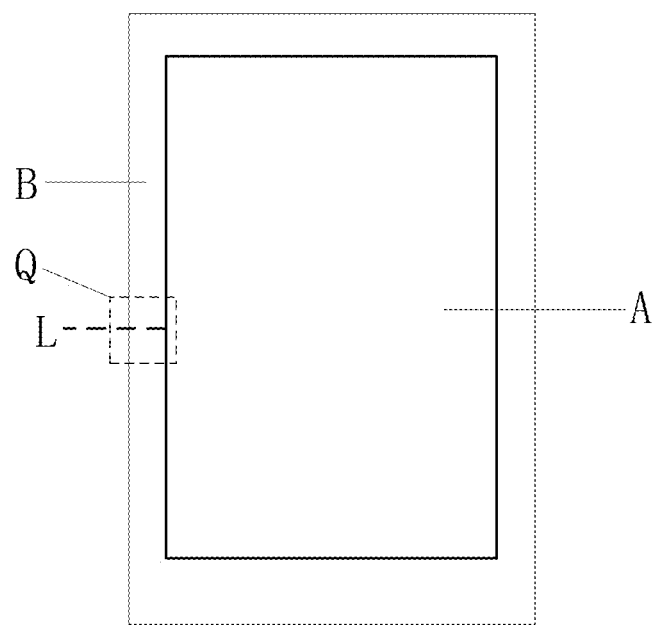
FIG. 1 is a top view of structural schematic diagram of a display panel provided by embodiments of the present disclosure.

With respect to a problem that an overlap area between a fixed potential signal line and a corresponding conductive connection layer provide is narrowed, embodiments of the present disclosure provide a display panel and a display device.

Some embodiments of the display panel and the display device provided by the present disclosure are described below in detail in combination with drawings. Thicknesses and shapes of various film layers in the drawings do not reflect real ratios, and are only intended to describe contents of the present disclosure.

Figure 2:
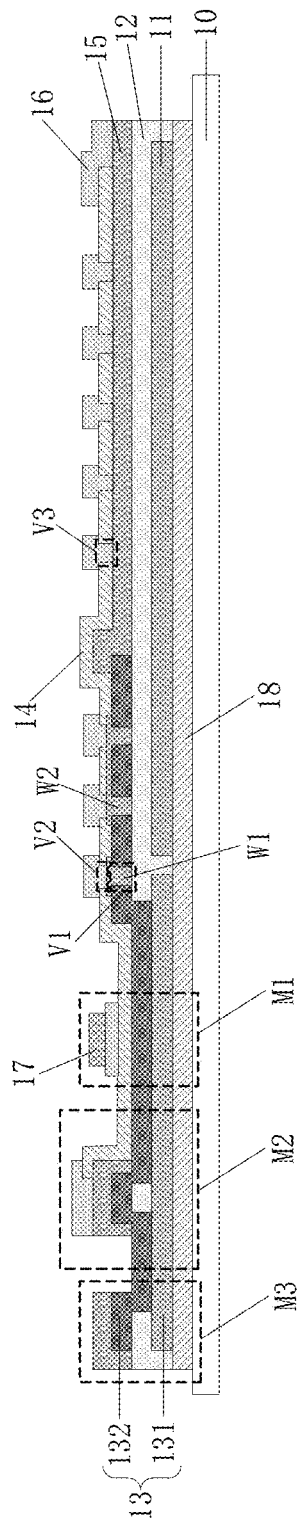
FIG. 2 is a schematic diagram of a section of FIG. 1 at a broken line L.

Some embodiments of the present disclosure provide a display panel. FIG. 1 is a top view of structural schematic diagram of a display panel provided by some embodiments of the present disclosure. FIG. 2 is a schematic diagram of a section of FIG. 1 at a broken line L. As shown in FIGS. 1 and 2, the display panel includes a display area A and a surrounding area B and may further include:

a substrate 10;

a first electrode (not showed in drawings), located on the substrate 10 in the display area A;

a second electrode (not showed in drawings), located on one side, away from the substrate 10, of the first electrode;

an organic light-emitting functional layer (not showed in drawings), located in the display area A and between the first electrode and the second electrode;

a line scanning drive circuit 11, located on the substrate 10 in the surrounding area B;

a first flat layer 12, located on one side, away from the substrate 10, of the line scanning drive circuit 11;

a fixed potential signal line 13 located in the surrounding area B, wherein the fixed potential signal line 13 includes a first conductive part 131, and a second conductive part 132 located on one side, away from the substrate 10, of the first conductive part 131;

an orthographic projection of the first conductive part 131 on the substrate 10 and an orthographic projection of the line scanning drive circuit 11 on the substrate 10 do not overlap with each other;

the second conductive part 132 is located on one side, away from the substrate 10, of the first flat layer 12; an overlapping area is formed between an orthographic projection of the second conductive part 132 on the substrate 10 and the orthographic projection of the line scanning drive circuit 11 on the substrate 10;

the second conductive part 132 includes a plurality of first through holes V1; an orthographic projection of the plurality of first through holes V1 on the substrate 10 is located in the overlapping area between the second conductive part 132 and the line scanning drive circuit 11; and a conductive connection layer 14, located on one side, away from the substrate 10, of the second conductive part 132, and arranged on the same layer as the first electrode, wherein the conductive connection layer 14 and the second conductive part 132 at least are in direct contact in the overlapping area between the second conductive part 132 and the line scanning drive circuit 11.

In the display panel provided by some embodiments of the present disclosure, the second conductive part in the fixed potential signal line extends to a position above the line scanning drive circuit, so that the overlap area between the fixed potential signal line and the conductive connection layer is widened; and overlap resistance between the fixed potential signal line and the corresponding conductive connection layer is decreased, thereby avoiding problems such as heating of the display panel and poor display uniformity. Moreover, the second conductive part includes a plurality of first through holes, and an orthographic projection of the first through holes on the substrate is located in the overlapping area between the second conductive part and the line scanning drive circuit. Thus, gases produced by the first flat layer in the technical process may be released via the plurality of first through holes; and problems that the gases produced in the first flat layer cannot be discharged so as to crack the upper film layer of the first flat layer due to extension of the second conductive part to a position above the line scanning drive circuit are avoided.

In some embodiments of the present disclosure, the above display panel may be an organic electroluminescence display panel. Optionally, the display panel may include the first electrode and the second electrode which are located in the display area, and the organic light-emitting functional layer. The first electrode may be an anode, and the second electrode may be a cathode; or the first electrode may be a cathode, and the second electrode may be an anode. The two electrodes are not limited herein. The organic light-emitting functional layer may include a light-emitting layer and an organic functional layer. The organic functional layer may be an electron injection layer, an electron transport layer, a hole injection layer, a hole transport layer and other film layers.

The fixed potential signal line 13 may be a low-level power signal line (VSS) and is in direct contact with the conductive connection layer 14. The second electrode extends into the surrounding area B to be electrically connected with the conductive connection layer 14, so that the fixed potential signal line 13 is electrically connected with the second electrode. A low-level power signal may be provided for the second electrode via the fixed potential signal line 13 in the display process.

Optionally, the fixed potential signal line 13 may include the first conductive part 131 and the second conductive part 132. The second conductive part 132 is located on one side, departing from the substrate 10, of the first conductive part 131, i.e., the first conductive part 131 and the second conductive part 132 are laminated. Thus, the width of the fixed potential signal line 13 may be decreased, and width of a bezel area B is decreased, thereby realizing the narrow bezel.

The line scanning drive circuit 11 is located in the surrounding area B and may be connected with scanning signal lines in the display area A. Scanning signals are input to the various scanning signal lines according to a set order so as to drive the various scanning signal lines to scan according to the set order. The first flat layer 12 is further arranged on one side, away from the substrate 10, of the line scanning drive circuit 11. The first flat layer 12 may cover the line scanning drive circuit 11 so as to achieve flattening and insulating effects.

Figure 3:
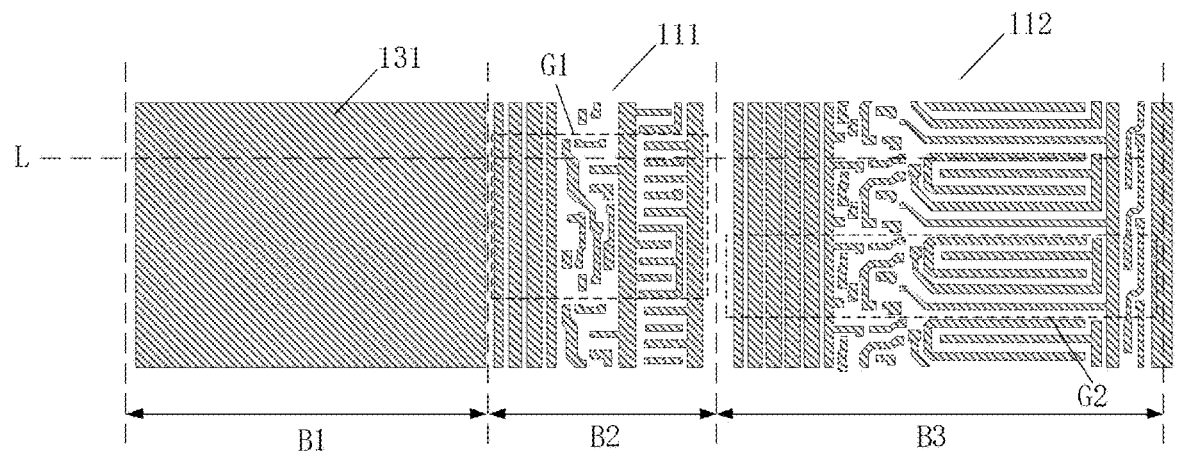
FIG. 3 is a top view of structural schematic diagram of a film layer where a first conductive part is located at a dotted box Q in FIG. 1.

In actual applications, one conductive layer in the line scanning drive circuit 11 may be arranged on the same layer as the first conductive part 131. Moreover, the orthographic projection of the first conductive part 131 on the substrate 10 and the orthographic projection of the line scanning drive circuit 11 on the substrate 10 do not overlap with each other, that is, the first conductive part 131 is insulated from the line scanning drive circuit 11. FIG. 3 is a top view of structural schematic diagram of a film layer where the first conductive part is located at a dotted box Q in FIG. 1. As shown in FIG. 3, a figure in an area B1 of FIG. 3 is the first conductive part 131; and figures in areas B2 and B3 of FIG. 3 are the line scanning drive circuit. It can be obviously seen from FIG. 3 that, the first conductive part 131 is insulated from the line scanning drive circuit.

Figure 4:
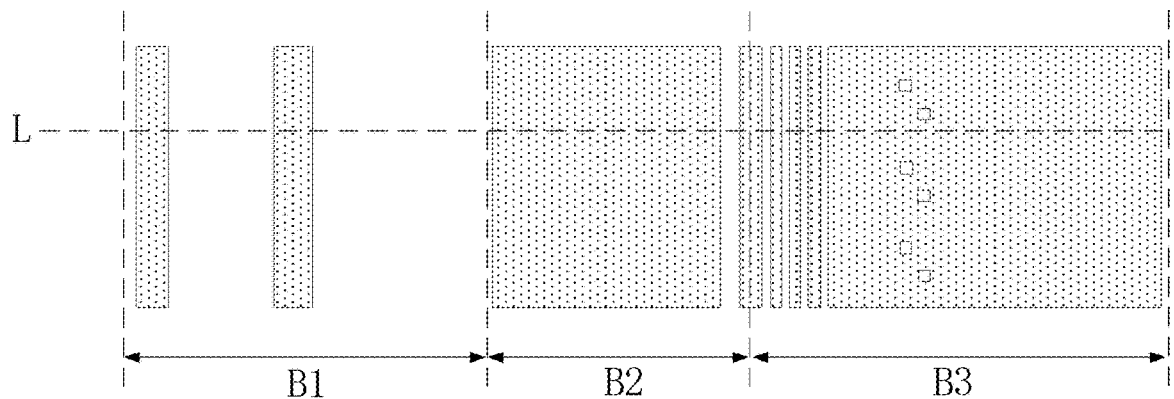
FIG. 4 is a top view of structural schematic diagram of a first flat layer at the dotted box Q in FIG. 1.

FIG. 4 is a top view of structural schematic diagram of a first flat layer at the dotted box Q in FIG. 1. As shown in FIG. 4, the area B1 in FIG. 4 corresponds to an area in which the first conductive part is located; and areas B2 and B3 of FIG. 4 correspond to an area in which the line scanning drive circuit is located. It can be seen from the FIGS. 3 and 4 that, the figure of the first flat layer covers the figure of the line scanning drive circuit.

As shown in FIG. 2, the second conductive part 132 is located on one side, away from the substrate 10, of the first flat layer 12. Therefore, both the second conductive part 132 and the line scanning drive circuit 11 can be insulated by the first flat layer 12. An overlapping area is formed between the orthographic projection of the second conductive part 132 on the substrate 10 and the orthographic projection of the line scanning drive circuit 11 on the substrate 10. An overlapping area is also formed between an orthographic projection of the conductive connection layer 14 on the substrate 10 and the orthographic projection of the line scanning drive circuit 11 on the substrate 10. Thus, the conductive connection layer 14 and the second conductive part 132 may be in direct contact in the overlapping area between the second conductive part 132 and the line scanning drive circuit 11, thereby widening the overlapping area between the second conductive part 132 and the conductive connection layer 14.

In addition, since the first flat layer 12 is made of an organic material, the first flat layer 12 may produce gases in the technical process. Since the second conductive part 132 covers the first flat layer 12, in the technical process after the second conductive part 132 is formed, the gases produced by the first flat layer 12 cannot be discharged due to coverage of the second conductive part 132, so that the second conductive part 132 is peeled from the first conductive part 12, or phenomena that the second conductive part 132 or other film layers crack and the like are caused, which becomes a major problem of increasing the overlapping area between the fixed potential signal line 13 and the conductive connection layer 14. In some embodiments of the present disclosure, by arranging the plurality of first through holes V1 in the second conductive part 132, the orthographic projection of the plurality of first through holes V1 on the substrate 10 is located in the overlapping area between the second conductive part 132 and the line scanning drive circuit 11, so that the gases produced by the first flat layer 12 can be smoothly discharged. Therefore, the overlapping area between the fixed potential signal line 13 and the conductive connection layer 14 is widened under a condition that the other film layers are not influenced.

Figure 7:
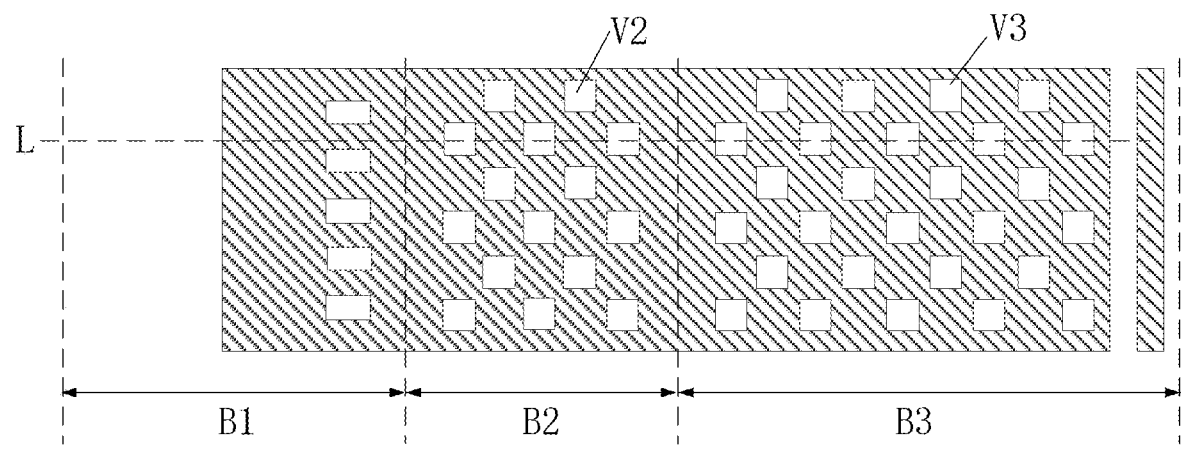
FIG. 7 is a top view of structural schematic diagram of a conductive connection layer at the dotted box Q in FIG. 1.

In some embodiments of the present disclosure, FIG. 7 is a top view of structural schematic diagram of a conductive connection layer at the dotted box Q in FIG. 1. As shown in FIG. 7, an area B1 in FIG. 7 corresponds to the area in which the first conductive part is located; and areas B2 and B3 in FIG. 7 correspond to the area in which the line scanning drive circuit is located. As shown in FIGS. 2 and 7, the conductive connection layer 14 includes a plurality of second through holes V2 that correspond to the plurality of first through holes V1 respectively; and an overlapping area is formed between the orthographic projection of the first through holes V1 on the substrate 10 and an orthographic projection of the corresponding second through holes V2 on the substrate 10.

The plurality of second through holes V2 that correspond to the first through holes V1 respectively are arranged in the conductive connection layer 14, and an overlapping area is formed between the second through holes V2 and the first through holes V1, so that the gases in the first flat layer 12 may be smoothly discharged in subsequent technical processes.

Optionally, in some embodiments of the present disclosure, pore sizes of the second through holes V2 are greater than pore sizes of the first through holes V1. Thus, a condition that the second through holes V2 cannot communicate with the corresponding first through holes V1 due to machining errors can be avoided, thereby further ensuring that the gases in the first flat layer 12 are smoothly discharged.

Figure 5:
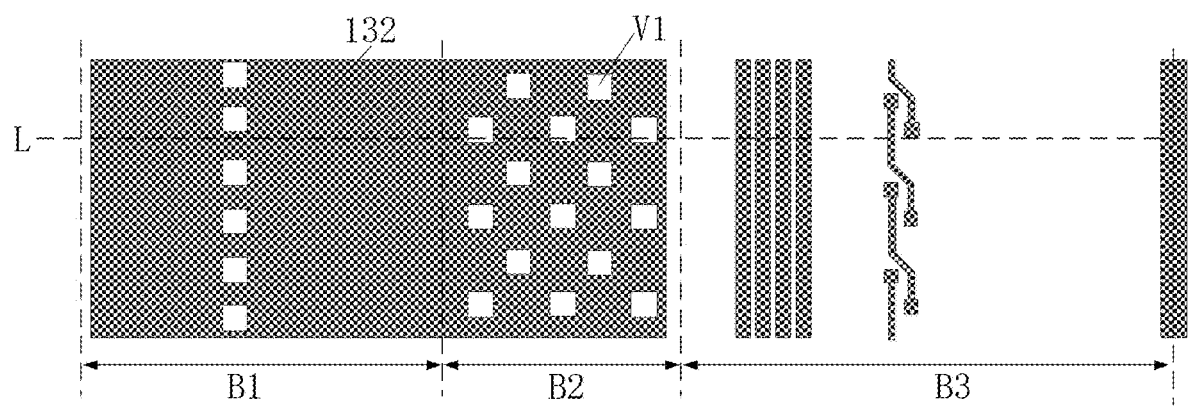
FIG. 5 is a top view of structural schematic diagram of a film layer where a second conductive part is located at the dotted box Q in FIG. 1.

It shall be noted that, arrangement manners of the first through holes and the second through holes are respectively illustrated in FIGS. 5 and 7, while arrangement and quantities of the first through holes and the second through holes are not limited. During specific implementation, the through holes can be arranged according to actual requirements.

In some embodiments of the present disclosure, the conductive connection layer 14 is arranged on the same layer as the first electrode. Therefore, the conductive connection layer 14 and the first electrode may be made by the same figure composition process, thereby saving the manufacturing process and saving manufacturing cost.

In the actual technical process, a first electrode layer needs to be formed first when the conductive connection layer 14 is manufactured, then the first electrode layer is subjected to wet etching so as to obtain figures of the plurality of first electrodes and the conductive connection layer 14. Since the first electrode layer contains metallic silver, the first electrode layer is soaked in an etching solution in the process of performing wet etching on the first electrode layer, and then silver ions in the first electrode layer are dissolved into the etching solution.

In some embodiments of the present disclosure, the first conductive part 131 generally includes three laminated metal layers. For example, metallic titanium, metallic aluminum and metallic titanium are laminated. Similarly, the second conductive part 132 may also include three laminated metal layers. For example, metallic titanium, metallic aluminum and metallic titanium are laminated.

In the wet etching process of the first electrode layer, if the side edge of the first conductive part 131 or the second conductive part 132 is exposed, the silver ions in the etching solution are subjected to a replacement reaction with the metallic aluminum on the side edge of the first conductive part 131 (or the second conductive part 132) so as to precipitate the metallic silver. The precipitated metallic silver floats to various positions of the display panel via the etching solution, thereby finally affecting display performance of the display panel.

In some embodiments of the present disclosure, referring to FIGS. 2 and 4, the first flat layer 12 is located on one side, away from the substrate 10, of the first conductive part 131; and the first flat layer 12 coats the side edge of the first conductive part 131. Therefore, the side edge of the first conductive part 131 is not exposed any more in the process of performing wet etching on the first electrode layer, thereby avoiding the metallic aluminum in the first conductive part 131 from reacting with the etching solution so as not to precipitate the metallic silver.

Further, as shown in FIG. 2, the display panel provided by the embodiments of the present disclosure may further include a second flat layer 15 located between the second conductive part 132 and the conductive connection layer 14, wherein the second flat layer 15 includes a filling part (such as W1 or W2 in the figure);

the filling part is configured to fill each of the first through holes V1; and the filling part covers the surface of the second conductive part 132 on the edge of each of the first through holes V1.

Figure 6:
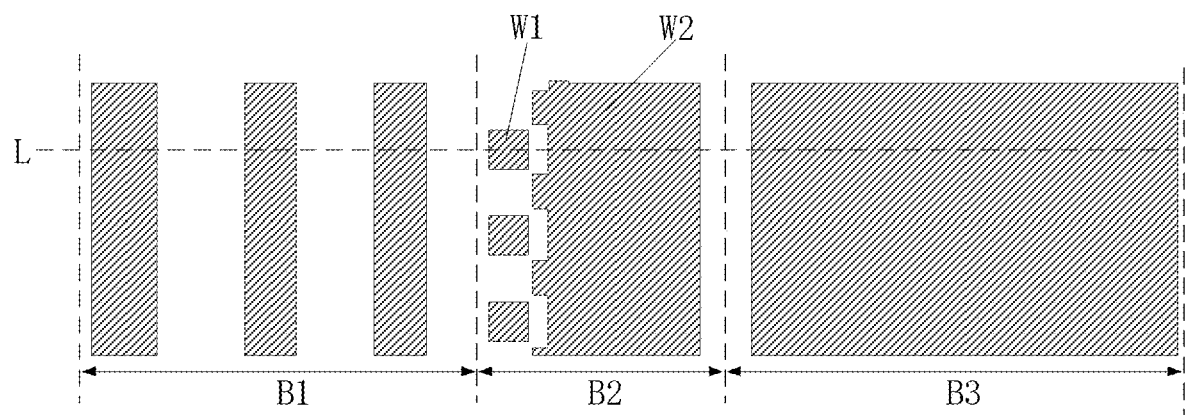
FIG. 6 is a top view of structural schematic diagram of a second flat layer at the dotted box Q in FIG. 1.

FIG. 5 is a top view of structural schematic diagram of a film layer where the second conductive part is located at the dotted box Q in FIG. 1. FIG. 6 is a top view of structural schematic diagram of the second flat layer at the dotted box Q in FIG. 1. As shown in FIGS. 5 and 6, an area B1 in the figures corresponds to the area in which the first conductive part is located; and areas B2 and B3 in the figures correspond to the area in which the line scanning drive circuit is located. It can be seen from FIGS. 5 and 6 that, the second flat layer may cover the first through holes V1 in the second conductive part 132.

Thus, the side edge of the second conductive part 132 at the first through holes V1 may be coated. In the subsequent process of performing wet etching on the first electrode layer, the metallic aluminum in the second conductive part 132 is avoided from being subjected to a replacement reaction with the etching solution, so that the metallic silver is prevented from being precipitated.

Further, in some embodiments of the present disclosure, the second flat layer 15 may further coat the side edge of the second conductive part 132, so that it can be ensured that the second conductive part 132 has no exposed side edge. In the subsequent process of performing wet etching on the first electrode layer, the metallic aluminum in the second conductive part 132 does not react with the etching solution, so that the metallic silver is prevented from being precipitated in the process of performing wet etching on the first electrode layer.

In actual applications, in the display panel in the embodiments of the present disclosure, as shown in FIG. 2, the conductive connection layer 14 coats the side edge of the filling part (such as the W1 or W2 in the figure).

In the display area, a pixel defining layer is used for defining a region of sub-pixels. The larger the area of a pattern of the pixel defining layer is, the smaller the area of the region of sub-pixels is. In addition, by considering the narrow bezel of the display panel, the area of the pattern of the pixel defining layer needs to be decreased as much as possible. Therefore, a size of the pattern of the pixel defining layer 16 at the second through holes V2 is smaller in the surrounding area. The conductive connection layer 14 is configured to coat the side edge of the filling part, so that the smaller size of the pixel defining layer 16 at the second through holes V2 may be ensured.

Optionally, as shown in FIGS. 2, 5 and 6, the filling part may include a first filling part W1 and a second filling part W2;

the first filling part W1 is configured to fill one of the first through holes V1;

the second filling part W2 is configured to fill at least two of the first through holes V1; and the edge of the second filling part W2 is of a zigzag shape meshed with the edges of the first through holes V1.

It can be obviously seen from comparison of FIGS. 5 and 6 that, in the zigzag-shaped change of the second filling part W2, an outwards protruding part corresponds to the positions of the first through holes V1, so that the second filling part W2 fills the first through holes V1 and covers the surface of the second conductive part 132 on the edges of the first through holes V1.

In actual applications, as shown in FIG. 2, the display panel provided by the embodiments of the present disclosure may further include a pixel defining layer 16 located on one side, away from the substrate 10, of the conductive connection layer 14;

wherein the pixel defining layer 16 fills each of the second through holes V2 and covers the surface of the conductive connection layer 14 on the edge of each of the second through holes V2.

The pixel defining layer 16 located in the display area A may be used for defining the region of sub-pixels. Moreover, the pixel defining layer 16 may extend into the surrounding area B, fills each of the second through holes V2 and covers the surface of the conductive connection layer on the edge of each of the second through holes V2. Therefore, the side edge of the conductive connection layer 14 can be coated, thereby avoiding the side edge of the conductive connection layer 14 from being exposed and preventing the conductive connection layer 14 from being injured by electrostatic discharge in the subsequent technical process.

Optionally, as shown in FIGS. 2 and 3, the line scanning drive circuit 11 may include a luminous control signal drive circuit 111 and a gate control signal drive circuit 112. The luminous control signal drive circuit may be electrically connected with a luminous control signal line in the display area, so that a luminous control signal may be input to the connected luminous control signal line. The gate control signal drive circuit may be electrically connected with a gate signal line in the display area, so that a gate control signal may be input to the connected gate signal line.

The gate control signal drive circuit 112 is located on one side, close to the display area A, of the luminous control signal drive circuit 111; and an orthographic projection of the edge of one side, close to the display area, of the second conductive part 132 on the substrate 10 is located in a range of an orthographic projection of the gate control signal drive circuit 112 on the substrate 10.

Thus, the overlapping area between the fixed potential signal line and the conductive connection layer may be widened at much as possible; and it is ensured that the structure in the display area is not affected.

Optionally, in some embodiments of the present disclosure, as shown in FIG. 3, the luminous control signal drive circuit 111 includes a plurality of first drive units G1;

the plurality of first through holes in the second conductive part include a plurality of first repeating groups that correspond to positions of the first drive units respectively; and each first repeating group includes at least one of the first through holes.

The luminous control signal drive circuit 111 includes the plurality of first drive units G1. The first drive units G1 may be shifting registers. The output end of a previous-level first drive unit G1 may serve as the input end of a next-level first drive unit G1, so that the first drive units G1 may be controlled to input luminous control signals to the connected luminous control signal line by levels.

In some embodiments of the present disclosure, the plurality of first through holes in the second conductive part include the plurality of first repeating groups that correspond to the positions of the first drive units respectively; and each first repeating group includes at least one of the first through holes, so that the positions of the first through holes corresponding to the first drive units G1 are consistent, thereby ensuring that the first drive unit G1 of each level is the same.

In addition, in FIG. 5, for example, the first through holes V1 are only formed in the area B2 corresponding to the luminous control signal drive circuit for illustration. During specific implementation, the first through holes may also be formed in the area B3 corresponding to the gate control signal drive circuit. Definition is not given herein.

Optionally, in some embodiments of the present disclosure, as shown in FIG. 3, the gate control signal drive circuit 112 includes a plurality of second drive units G2;

the plurality of first through holes in the second conductive part may further include a plurality of second repeating groups that correspond to positions of the second drive units respectively; and each second repeating group includes at least one of the first through holes.

The gate control signal drive circuit 112 includes the plurality of second drive units G2. The second drive units G2 may also be shifting registers. The output end of a previous-level second drive unit G2 may serve as the input end of a next-level second drive unit G2, so that the second drive units G2 may be controlled to input gate control signals to the connected gate control signal line by levels.

In some embodiments of the present disclosure, the plurality of first through holes in the second conductive part further include the plurality of second repeating groups that correspond to the positions of the second drive units respectively; and each second repeating group includes at least one of the first through holes, so that the positions of the first through holes corresponding to the second drive units G2 are consistent, thereby ensuring that the second drive unit G2 of each level is the same.

In some embodiments of the present disclosure, as shown in FIGS. 2 and 7, the conductive connection layer 14 may further include a plurality of third through holes V3;

wherein an overlapping area is formed between an orthographic projection of the third through holes V3 on the substrate 10 and the orthographic projection of the second flat layer 15 on the substrate 10.

The plurality of third through holes V3 are formed in the conductive connection layer 14, and the overlapping area is formed between the third through holes V3 and the second flat layer 15. Therefore, gases in the second flat layer can be discharged via the third through holes V3.

In addition, in some embodiments of the present disclosure, the pixel defining layer 16 may fill each of the third through holes V3 and covers the surface of the conductive connection layer 14 on the edge of each of the third through holes V3, so that the side edge of the conductive connection layer 14 can be coated, thereby avoiding the side edge of the conductive connection layer 14 from being exposed and preventing the conductive connection layer 14 from being injured by electrostatic discharge in the subsequent technical process.

In actual applications, as shown in FIG. 2, the display panel provided by some embodiments of the present disclosure may further include a first retaining wall M1, a second retaining wall M2 and a third retaining wall M3. The first retaining wall M1 surrounds the display area; the second retaining wall M2 surrounds the first retaining wall M1; and the third retaining wall M3 surrounds the second retaining wall M2. Optionally, the first retaining wall M1 is composed of the first conductive part 131, the second conductive part 132, the conductive connection layer 14, the pixel defining layer 16, a supporting structure 17 and other film layers. The supporting structure 17 may be arranged on the same layer as spacers. The second retaining wall M2 may be composed of the first conductive part 131, the first flat layer 12, the second conductive part 132, the second flat layer 15, the pixel defining layer 16 and other film layers. The third retaining wall M3 may be composed of the first conductive part 131, the first flat layer 12, the second conductive part 132, the second flat layer 15 and other film layers. In addition, the first retaining wall M1, the second retaining wall M2 and the third retaining wall M3 may also be composed of the other film layers and are not limited herein.

In the actual technical process, various film layers corresponding to a plurality of display panels are manufactured in a display motherboard, and then the display motherboard is cut to obtain a plurality of display panels, so that the efficiency of manufacturing the display panel can be increased. To prevent cracks produced in the cutting process from propagating into the display area, at least one retaining wall may be arranged in the surrounding area so as to block transport of the cracks. In some embodiments of the present disclosure, three retaining walls are taken as examples for illustration. The quantity of the retaining walls is not limited.

In addition, as shown in FIG. 2, the display panel provided by the embodiments of the present disclosure may further include a buffer layer 18 located between the substrate 10 and a film layer where the first conductive part 131 is located.

Figure 8:
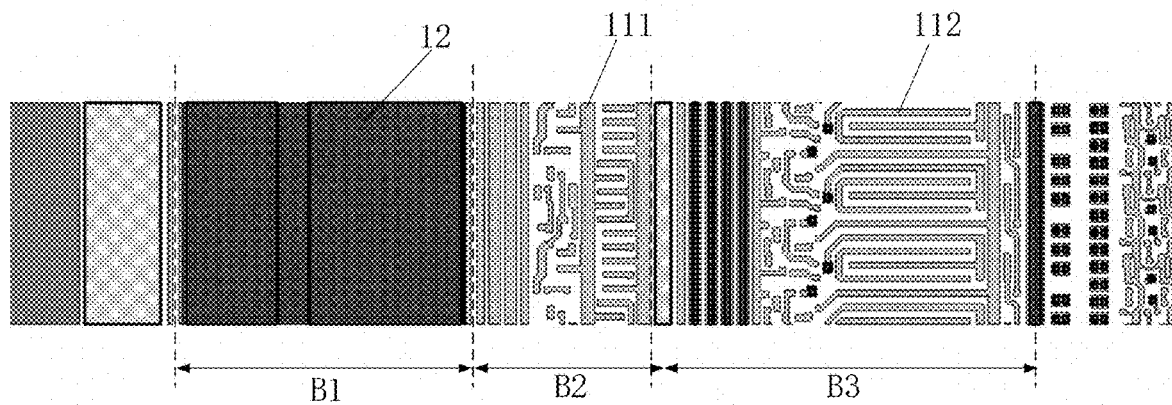
FIG. 8 is a laminated structural schematic diagram of the film layer where the first conductive part is located and a first flat layer.
Figure 9:
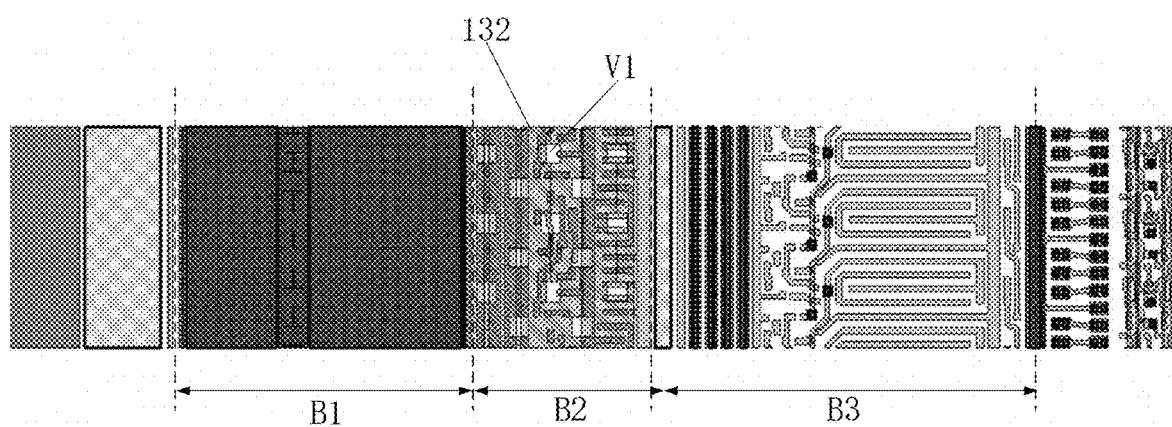
FIG. 9 is a laminated structural schematic diagram after the film layer where the second conductive part is located is superposed on the basis of FIG. 8.
Figure 10:
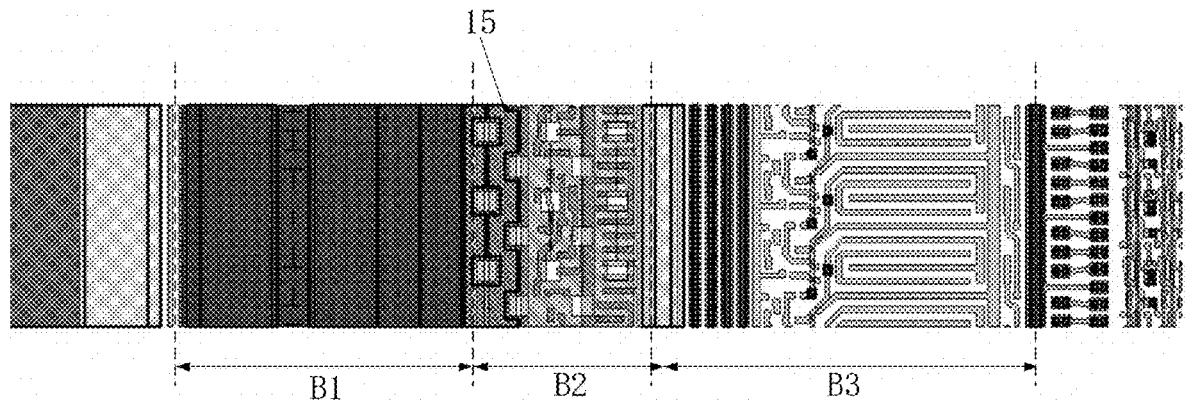
FIG. 10 is a laminated structural schematic diagram after a second flat layer is superposed on the basis of FIG. 9.
Figure 11:
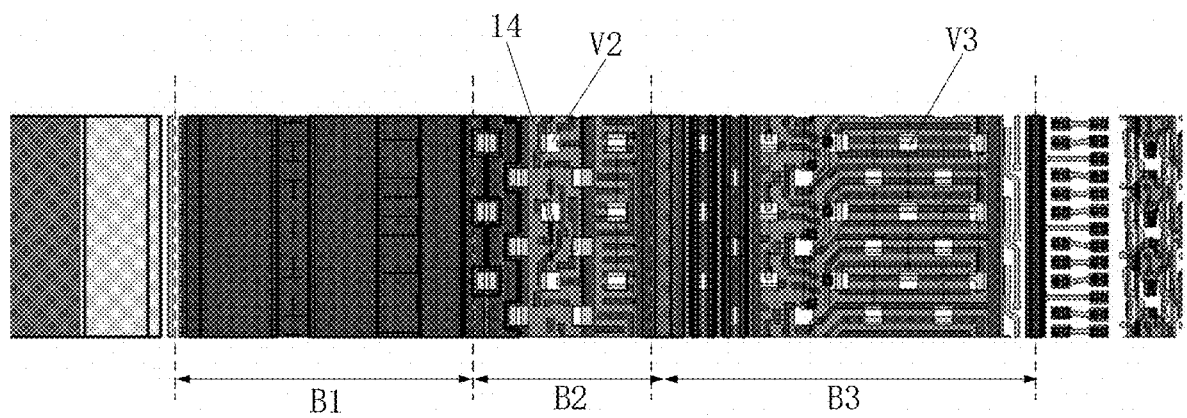
FIG. 11 is a laminated structural schematic diagram after a film layer where a conductive connection layer is located is superposed on the basis of FIG. 10.

To clearly illustrate a corresponding position relation of the various film layers in the embodiments of the present disclosure, FIGS. 8-11 show laminated schematic diagrams of the various film layers. FIG. 8 is a laminated structural schematic diagram of a film layer where the first conductive part is located and a first flat layer. FIG. 9 is a laminated structural schematic diagram after a film layer where the second conductive part is located is superposed on the basis of FIG. 8. FIG. 10 is a laminated structural schematic diagram after the second flat layer is superposed on the basis of FIG. 9. FIG. 11 is a laminated structural schematic diagram after a film layer where the conductive connection layer is located is superposed on the basis of FIG. 10. It shall be noted that, to clearly illustrate the laminated structures of the various film layers, in the FIGS. 8-11, an area that is not filled in the first flat layer is the figure of the first flat layer; and an area that is not filled in the second flat layer is the figure of the second flat layer.

Based on the same inventive concept, some embodiments of the present disclosure further provide a display device. The display device includes the above display panel and may be applied to products or components having display functions, such as a mobile phone, a tablet personal computer, a TV, a display, a laptop, a digital photo frame and a navigator. Since a principle of the display device for solving problems is similar to that of the display panel, implementation of the display device may refer to implementation of the above display panel. Unnecessary details of repeated parts shall not be given herein.

According to the display panel and the display device provided by some embodiments of the present disclosure, the second conductive part in the fixed potential signal line extends to a position above the line scanning drive circuit, so that the overlap area between the fixed potential signal line and the conductive connection layer is widened; and overlap resistance between the fixed potential signal line and the corresponding conductive connection layer is decreased, thereby avoiding problems such as heating of the display panel and poor display uniformity. Moreover, the second conductive part includes the plurality of first through holes, and the first through holes are located in the overlapping area between the second conductive part and the line scanning drive circuit. Thus, gases produced by the first flat layer in the technical process can be released via the plurality of first through holes; and problems that the gases produced in the first flat layer cannot be discharged so as to crack the upper film layer of the first flat layer due to extension of the second conductive part to a position above the line scanning drive circuit are avoided.

Although the preferred embodiments of the present disclosure have been described, once basic creative concept is known by those skilled in the art, additional changes and modifications may be made to these embodiments. Therefore, the appended claims are intended to be explained to include the preferred embodiments and all the changes and modifications falling within the scope of the present disclosure.

Apparently, various modifications and variations may be made to embodiments of the present disclosure by those skilled in the art without departing from the spirit and scope of embodiments of the present disclosure. Thus, if these modifications and variations of embodiments of the present disclosure belong to the scope of the claims of the present disclosure and equivalent technologies thereof, the present disclosure is also intended to include these modifications and variations.

What is claimed is:

1. A display panel, comprising: a display area and a surrounding area, and further comprising:
   a substrate;
   a first electrode, located on the substrate in the display area;
   a second electrode, located on one side, away from the substrate, of the first electrode;
   an organic light-emitting functional layer, located in the display area and between the first electrode and the second electrode;
   a line scanning drive circuit, located on the substrate in the surrounding area;
   a first flat layer, located on one side, away from the substrate, of the line scanning drive circuit;
   a fixed potential signal line located in the surrounding area, wherein the fixed potential signal line comprises a first conductive part, and a second conductive part located on one side, away from the substrate, of the first conductive part;
   an orthographic projection of the first conductive part on the substrate and an orthographic projection of the line scanning drive circuit on the substrate do not overlap with each other;
   the second conductive part is located on one side, away from the substrate, of the first flat layer; an overlapping area is formed between an orthographic projection of the second conductive part on the substrate and the orthographic projection of the line scanning drive circuit on the substrate;
   the second conductive part comprises a plurality of first through holes; an orthographic projection of the plurality of first through holes on the substrate is located in the overlapping area between the second conductive part and the line scanning drive circuit; and
   a conductive connection layer, located on one side, away from the substrate, of the second conductive part, and arranged on a layer same as a layer on which the first electrode is, wherein the conductive connection layer and the second conductive part at least are in direct contact in the overlapping area between the second conductive part and the line scanning drive circuit.

2. The display panel according to claim 1, wherein the conductive connection layer comprises a plurality of second through holes that correspond to the plurality of first through holes respectively; and
   an overlapping area is formed between the orthographic projection of the first through holes on the substrate and an orthographic projection of corresponding second through holes on the substrate.

3. The display panel according to claim 2, wherein pore sizes of the second through holes are greater than pore sizes of corresponding first through holes.

4. The display panel according to claim 1, wherein the first flat layer is located on one side, away from the substrate, of the first conductive part and coats a side edge of the first conductive part.

5. The display panel according to claim 2, further comprising: a second flat layer located between the second conductive part and the conductive connection layer, wherein
the second flat layer comprises a filling part;
the filling part is configured to fill each of the first through holes; and the filling part covers a surface of the second conductive part on the edge of each of the first through holes.

6. The display panel according to claim 5, wherein the second flat layer coats a side edge of the second conductive part.

7. The display panel according to claim 5, wherein the conductive connection layer coats the side edge of the filling part.

8. The display panel according to claim 2, wherein the filling part comprises a first filling part and a second filling part;
the first filling part is configured to fill one of the first through holes;
the second filling part is configured to fill at least two of the first through holes; and an edge of the second filling part is of a zigzag shape meshed with edges of the first through holes.

9. The display panel according to claim 2, further comprising: a pixel defining layer located on one side, away from the substrate, of the conductive connection layer;
wherein the pixel defining layer fills each of the second through holes and covers the surface of the conductive connection layer on the edge of each of the second through holes.

10. The display panel according to claim 2, wherein the line scanning drive circuit comprises a luminous control signal drive circuit and a gate control signal drive circuit,
wherein the gate control signal drive circuit is located on one side, close to the display area, of the luminous control signal drive circuit; and
an orthographic projection of the edge of one side, close to the display area, of the second conductive part on the substrate is located in a range of an orthographic projection of the gate control signal drive circuit on the substrate.

11. The display panel according to claim 10, wherein the luminous control signal drive circuit comprises a plurality of first drive units;
the plurality of first through holes in the second conductive part comprise a plurality of first repeating groups that correspond to positions of the first drive units respectively; and
each first repeating group comprises at least one of the first through holes.

12. The display panel according to claim 11, wherein the gate control signal drive circuit comprises a plurality of second drive units;
the plurality of first through holes in the second conductive part further comprise a plurality of second repeating groups that correspond to positions of the second drive units respectively; and
each second repeating group comprises at least one of the first through holes.

13. The display panel according to claim 9, wherein the conductive connection layer further comprises a plurality of third through holes; and
an overlapping area is formed between an orthographic projection of the third through holes on the substrate and an orthographic projection of the second flat layer on the substrate.

14. The display panel according to claim 13, wherein the pixel defining layer fills each of the third through holes and covers the surface of the conductive connection layer on the edge of each of the third through holes.

15. A display device, comprising: a display panel, wherein the display panel comprises a display area and a surrounding area, and further comprises:
a substrate;
a first electrode, located on the substrate in the display area;
a second electrode, located on one side, away from the substrate, of the first electrode;
an organic light-emitting functional layer, located in the display area and between the first electrode and the second electrode;
a line scanning drive circuit, located on the substrate in the surrounding area;
a first flat layer, located on one side, away from the substrate, of the line scanning drive circuit a fixed potential signal line located in the surrounding area, wherein the fixed potential signal line comprises a first conductive part, and a second conductive part located on one side, away from the substrate, of the first conductive part;
an orthographic projection of the first conductive part on the substrate and an orthographic projection of the line scanning drive circuit on the substrate do not overlap with each other;
the second conductive part is located on one side, away from the substrate, of the first flat layer; an overlapping area is formed between an orthographic projection of the second conductive part on the substrate and the orthographic projection of the line scanning drive circuit on the substrate;
the second conductive part comprises a plurality of first through holes; an orthographic projection of the plurality of first through holes on the substrate is located in the overlapping area between the second conductive part and the line scanning drive circuit; and
a conductive connection layer, located on one side, away from the substrate, of the second conductive part, and arranged on a layer same as a layer on which the first electrode is, wherein the conductive connection layer and the second conductive part at least are in direct contact in the overlapping area between the second conductive part and the line scanning drive circuit.

16. The display device according to claim 15, wherein the conductive connection layer comprises a plurality of second through holes that correspond to the plurality of first through holes respectively; and
an overlapping area is formed between the orthographic projection of the first through holes on the substrate and an orthographic projection of corresponding second through holes on the substrate.

17. The display device according to claim 16, wherein pore sizes of the second through holes are greater than pore sizes of corresponding first through holes.

18. The display device according to claim 15, wherein the first flat layer is located on one side, away from the substrate, of the first conductive part and coats a side edge of the first conductive part.

19. The display device according to claim 16, further comprising: a second flat layer located between the second conductive part and the conductive connection layer, wherein the second flat layer comprises a filling part;
the filling part is configured to fill each of the first through holes; and the filling part covers a surface of the second conductive part on the edge of each of the first through holes.

20. The display device according to claim 19, wherein the second flat layer coats a side edge of the second conductive part.

\* \* \* \* \*